US012635087B2

(12) United States Patent
Wu et al.

(10) Patent No.: US 12,635,087 B2
(45) Date of Patent: May 19, 2026

(54) WEARABLE DEVICE

(71) Applicants:Chengdu BOE Optoelectronics Technology Co., Ltd., Chengdu (CN); BOE Technology Group Co., Ltd., Beijing (CN); Beijing BOE Technology Development Co., Ltd., Beijing (CN)

(72) Inventors: Qiang Wu, Beijing (CN); Guowang Mu, Beijing (CN); Xiaolin Liu, Beijing (CN); Hong Zhu, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 149 days.

(21) Appl. No.: 18/687,318

(22) PCT Filed: May 30, 2023

(86) PCT No.: PCT/CN2023/097263
§ 371 (c)(1),
(2) Date: Feb. 28, 2024

(87) PCT Pub. No.: WO2024/243826
PCT Pub. Date: Dec. 5, 2024

(65) Prior Publication Data
US 2025/0247974 A1       Jul. 31, 2025

(51) Int. Cl.
H05K 5/02          (2006.01)
G06F 1/16          (2006.01)
H05K 5/00          (2006.01)

(52) U.S. Cl.
CPC ......... H05K 5/0217 (2013.01); G06F 1/1652 (2013.01); H05K 5/0086 (2013.01)

(58) Field of Classification Search
CPC ..... G06F 1/1652; G06F 1/163; H05K 5/0217; H05K 5/0086
See application file for complete search history.

(56) References Cited

U.S. PATENT DOCUMENTS 12,177,994 B2 * 12/2024 Valeriy ............... H04M 1/0235
2013/0058063 A1 * 3/2013 O'Brien ............... G06F 1/1624
361/807

(Continued)

FOREIGN PATENT DOCUMENTS

CN          104737114 B     12/2018
CN          208523936 U      2/2019

(Continued)

OTHER PUBLICATIONS

Chengyang Liu et al., "Application of intelligent sportswear based on fiber-based flexible intelligent wearable technology", Wool Textile Journal, vol. 48, No. 5, May 16, 2020, DOI: 10.19333 /j.mfkj. 20191000405, pp. 66-70, total 5 pages; with English translation of abstract.

Primary Examiner — Sagar Shrestha
(74) Attorney, Agent, or Firm — XSENSUS LLP

(57)          ABSTRACT
Provided is a wearable device. The wearable device comprises a sliding display apparatus, a base, and a watchband, wherein two ends of the watchband are connected to the base. The sliding display apparatus comprises a fixed portion, a movable portion, a flexible display panel, and a connecting assembly. The fixed portion is connected to the base. The movable portion is slideable in a first direction relative to the fixed portion and is connected to the fixed portion. The flexible display panel is connected to the fixed portion and the movable portion. The connecting assembly
(Continued)

comprises an elastic connector connected between the fixed portion and the movable portion, and the elastic connector provides an acting force for urging the movable portion and the fixed portion to approach each other in the first direction.

19 Claims, 11 Drawing Sheets

(56) References Cited

U.S. PATENT DOCUMENTS

| 2013/0254705 | A1 | | 9/2013 | Mooring | |
|---|---|---|---|---|---|
| 2016/0073519 | A1 | * | 3/2016 | Hiroki | G06F 1/16 |
| | | | | | 361/749 |
| 2018/0102072 | A1 | * | 4/2018 | Lee | G02F 1/133305 |
| 2019/0064882 | A1 | * | 2/2019 | Xia | A44C 5/00 |
| 2019/0205721 | A1 | * | 7/2019 | Zhou | G06K 19/07762 |
| 2021/0250670 | A1 | * | 8/2021 | Jun | H04N 23/54 |
| 2022/0417355 | A1 | * | 12/2022 | Liu | G06F 1/1652 |
| 2022/0418123 | A1 | | 12/2022 | Liu et al. | |
| 2022/0418125 | A1 | * | 12/2022 | Li | H05K 5/0017 |
| 2023/0113925 | A1 | * | 4/2023 | Kang | G06F 21/32 |
| | | | | | 361/807 |
| 2023/0393623 | A1 | | 12/2023 | Wang et al. | |
| 2024/0255990 | A1 | * | 8/2024 | Shan | G06F 1/163 |

FOREIGN PATENT DOCUMENTS

| CN | 209498806 | U | 10/2019 |
|---|---|---|---|
| CN | 111899644 | A | 11/2020 |
| CN | 215501608 | U | 1/2022 |
| CN | 215679067 | U | 1/2022 |
| CN | 215729326 | U | 2/2022 |
| CN | 115273668 | A | 11/2022 |
| CN | 115529370 | A | 12/2022 |
| CN | 115699137 | A | 2/2023 |
| WO | 2015/173464 | A1 | 11/2015 |

* cited by examiner

WEARABLE DEVICE

CROSS-REFERENCE TO RELATED APPLICATION

This application is a U.S. national phase application based on PCT/CN2023/097263, filed on May 30, 2023, the content of which is incorporated herein by reference in its entirety.

TECHNICAL FIELD

Embodiments of the present disclosure relate to the field of display technologies, and in particular, relate to a wearable device.

BACKGROUND

Wearable devices, such as smart watches, have attracted public attention due to their beautiful appearances and rich functions. As people's requirements for wearable device products increase, in the process of dealing with different tasks, such as watching videos and making phone calls, it is necessary to enhance the product experience by increasing or decreasing the display area.

SUMMARY

Embodiments of the present disclosure provide a wearable device. The technical solutions are as follows.

The embodiments of the present disclosure provide a wearable device. The wearable device includes a sliding display apparatus, a base, and a watchband, wherein the sliding display apparatus is connected to the base, and two ends of the watchband are connected to the base; and the sliding display apparatus includes a fixed portion, a movable portion, a flexible display panel, and a connecting assembly, wherein the fixed portion is connected to the base; the movable portion is connected to the fixed portion and is slideable in a first direction relative to the fixed portion; a part of the flexible display panel is connected to the fixed portion, and another part of the flexible display panel is connected to the movable portion; and the connecting assembly includes an elastic connector connected between the fixed portion and the movable portion and configured to provide an acting force for urging the movable portion and the fixed portion to approach each other in the first direction.

Optionally, the connecting assembly further includes a limiting structure, the limiting structure is connected to at least one of the movable portion and the fixed portion and is configured to limit a position of the elastic connector in a direction other than the first direction.

Optionally, the limiting structure includes a bump, wherein the bump is connected to the movable portion and is provided with a limiting channel therein, an extension direction of the limiting channel being the first direction, and a middle part of the elastic connector being disposed in the limiting channel.

Optionally, the elastic connector is an extension spring.

Optionally, a first surface of the bump is provided with at least two limiting holes, the at least two limiting holes being arranged in the first direction; and the connecting assembly further includes a hovering assembly, the hovering assembly being disposed on the fixed portion and configured to be operatively snapped into one of the at least two limiting holes.

Optionally, the hovering assembly includes a first clamping member, an elastic resetting member, and a supporting member; wherein a first end of the first clamping member is provided with a baffle matching the limiting hole and is disposed in the fixed portion, and a second end of the first clamping member is disposed outside the fixed portion; the supporting member is disposed in the fixed portion, is on a side of the first clamping member distal from the bump, and is connected to the fixed portion; and one end of the elastic resetting member is disposed in the supporting member, and another end of the elastic resetting member abuts against the first clamping member and is configured to provide pressure for limiting the baffle in the limiting hole.

Optionally, the hovering assembly further includes a second clamping member, wherein the second clamping member is disposed in the fixed portion, is on a side of the first clamping member distal from the bump, and is connected to the fixed portion; the first clamping member is provided with a clamping slot therein, the clamping slot being disposed on a surface of the first clamping member proximal to the second clamping member and is proximal to the second end; and the second clamping member is configured to be disposed in the clamping slot when the baffle is disposed outside the limiting hole.

Optionally, the fixed portion includes a bottom plate and a plurality of side walls connected to the bottom plate; and the movable portion includes a main body and two connecting arms, wherein the two connecting arms are connected to two ends of the main body and are parallel to each other; wherein the main body and the plurality of side walls enclose an accommodating cavity, the two connecting arms being disposed in the accommodating cavity.

Optionally, the bottom plate is provided with a plurality of chutes, wherein the plurality of chutes are arranged in a second direction, the second direction being perpendicular to the first direction and parallel to the bottom plate; and the movable portion further includes a plurality of comb teeth, the plurality of comb teeth being arranged in the second direction and connected to the main body; wherein the plurality of comb teeth and the plurality of chutes are staggered and meshed with each other, and the plurality of comb teeth are slideable in the plurality of chutes in the first direction.

Optionally, the plurality of comb teeth include at least one clamping comb tooth, wherein a dimension of a first part of the clamping comb tooth in the second direction is larger than a dimension of a second part of the clamping comb tooth in the second direction; and the clamping comb tooth and the chute where the clamping comb tooth is disposed cooperate to limit a maximum sliding distance of the plurality of comb teeth relative to the plurality of chutes in the first direction.

Optionally, the sliding display apparatus further includes a first electronic device, a first circuit board, and a first flexible connector; wherein the first electronic device is connected to the movable portion, the first circuit board is connected to the fixed portion, and the first flexible connector connects the first electronic device to the first circuit board.

Optionally, the first electronic device is a speaker component.

Optionally, the base includes a substrate and two side walls, wherein the two side walls are disposed on two opposite sides of the substrate and are connected to the substrate, and a first surface of the substrate is provided with a first groove, such that a gap exists between the movable portion and the first surface, and the first surface is disposed between the two side walls; and the fixed portion and the movable portion are disposed on the first surface and between the two side walls.

Optionally, the first surface of the substrate is further provided with a second groove, the second groove being communicated with the first groove; and the sliding display apparatus further includes a second circuit board and a second electronic device, wherein the second circuit board and the second electronic device are both disposed in the second groove, the second circuit board is connected to the base and electrically connected with the first circuit board, and the second electronic device is electrically connected with the second circuit board.

Optionally, the substrate is provided with an opening therein, the opening being disposed in the second groove; and the second electronic device includes a health monitoring sensor, the health monitoring sensor being disposed at the opening.

Optionally, the sliding display apparatus further includes a wireless charging coil, wherein the wireless charging coil is disposed in the second groove, and the wireless charging coil is electrically connected with the second circuit board.

Optionally, the sliding display apparatus further includes a third electronic device, wherein the third electronic device is electrically connected with the first circuit board and connected to the fixed portion; and the third electronic apparatus includes at least one of a knob, a vibrating motor, a microphone component, a transmission interface, a key, and a battery block.

Optionally, the third electronic device includes a knob, a vibrating motor, a microphone component, a transmission interface, a key, and a battery block; the knob, the microphone component, the transmission interface, and the key are arranged in a second direction, the second direction being perpendicular to the first direction and perpendicular to a display surface of the sliding display apparatus; the knob and the vibrating motor are arranged in the first direction; and the battery block is disposed on one side of the first circuit board.

Optionally, the watchband includes a flexible battery and a battery output portion, wherein the flexible battery is electrically connected with the sliding display apparatus through the battery output portion.

Optionally, the watchband includes a first part, a second part, and an elastic watchband connector, wherein one end of the first part and one end of the second part are connected by the watchband connector, and another end of the first part and another end of the second part are connected to the base.

Optionally, the flexible display panel includes an adhesive fixing region and a sliding region, wherein the adhesive fixing region is connected to the fixed portion, and the sliding region is connected to the movable portion; the sliding display apparatus further includes a supporting structure, the supporting structure being disposed in the sliding region and on a back side of the flexible display panel; and the supporting structure includes a plurality of support bars, the plurality of support bars being arranged in the first direction.

The embodiments of the present disclosure provide a wearable device. The wearable device includes a sliding display apparatus, a base, and a watchband, wherein the sliding display apparatus is connected to the base, and two ends of the watchband are connected to the base; the sliding display apparatus includes s a fixed portion, a movable portion, a flexible display panel, and a connecting assembly, wherein the fixed portion is connected to the base, and the fixed portion includes a bottom plate and a plurality of side walls connected to the bottom plate; the movable portion includes a main body and two connecting arms, wherein the two connecting arms are connected to two ends of the main body and are parallel to each other, the main body and the plurality of side walls enclose an accommodating cavity, the two connecting arms are disposed in the accommodating cavity, and each connecting arm is slideably connected to the side wall, such that the movable portion is slideable in a first direction relative to the fixed portion; a part of the flexible display panel is connected to the fixed portion, and another part of the flexible display panel is connected to the movable portion; the connecting assembly includes an elastic connector, a limiting structure, and a hovering assembly; the elastic connector is connected between the fixed portion and the movable portion and is configured to provide an acting force for urging the movable portion and the fixed portion to approach each other in the first direction; the limiting structure includes a bump connected to the connecting arm and provided with a limiting channel therein, wherein an extension direction of the limiting channel is the first direction, a middle part of the elastic connector is disposed in the limiting channel, a first surface of the bump is provided with at least two limiting holes, and the at least two limiting holes are arranged in the first direction; and the hovering assembly is disposed in the accommodating cavity, is connected to the fixed portion, and is configured to be operatively snapped into one of the at least two limiting holes.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

Figure 1:
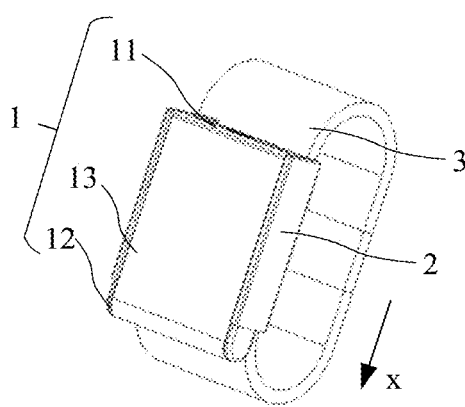
FIG. 1 is a schematic structural diagram of a wearable device in a folded state according to some embodiments of the present disclosure.

Reference numerals in the drawings are described as below:

1—sliding display apparatus; 2—base; 3—watchband; x—first direction; y—second direction;

11—fixed portion;

111—bottom plate; 112—side wall; 113—chute; 1131— clamping chute;

11311—first part of clamping chute; 11312—second part of clamping chute;

12—movable portion;

121—main body; 122—connecting arm; 122a—connecting arm; 122b—connecting arm; 123—comb tooth; 1231—clamping comb tooth;

12311—first part of clamping comb tooth; 12312—second part of clamping comb tooth; 13—flexible display panel;

131—adhesive fixing region; 132—sliding region; 133— light-exiting surface; 134—back side;

14—connecting assembly;

141—elastic connector; 141a—elastic connector; 141b— elastic connector;

142—limiting structure; 143—hovering assembly;

1421—bump; 14211—limiting channel; 14212—first surface; 14213—limiting hole;

1431—first clamping member; 1432—elastic resetting member; 1433—supporting member;

1434—second clamping member;

14311—first rod; 14312—baffle;

14313—clamping slot; 14314—state-switching toggle;

14341—second limiting baffle;

15—first electronic device; 16—first circuit board; 17—first flexible connector;

18—second circuit board; 19—health monitoring sensor; 20—wireless charging coil;

21—third electronic device; 211—knob; 212—microphone component;

213—transmission interface; 214—key; 215—battery block;

216—vibrating motor; 22—supporting structure; 221— support bar;

201—first groove; 202—second groove; 203—opening; 204—screw;

205—substrate; 206—side wall; 206a—side wall; 206b—side wall;

31—watchband connector; 32—battery output portion; 32a—battery output portion; 32b—battery output portion; 33—first part of watchband; 34—second part of watchband;

35—first fixing hole; 36—second fixing hole.

DETAILED DESCRIPTION

For clearer descriptions of the objectives, technical solutions, and advantages of the present disclosure, embodiments of the present disclosure are described in detail hereinafter with reference to the accompanying drawings.

The terms used in the present disclosure are only used to explain the embodiments of the present disclosure, and are not intended to limit the present disclosure. Unless otherwise defined, technical terms or scientific terms used in the embodiments of the present disclosure shall be taken to mean the ordinary meanings as understood by those of ordinary skill in the art to which the present disclosure belongs. The terms "first," "second," "third," and the like used in the description and the claims of the patent application of the present disclosure do not denote any order, quantity, or importance, and are merely used to distinguish different components. Similarly, the term "one," "a," "an," or the like is not intended to limit the number, and to denote the number of at least one. The term "comprise," "include," or the like is intended to mean that the elements or objects before said term cover the elements or objects or equivalents listed after said term, without excluding other elements or objects.

In the related art, a wearable device includes a watch casing and a flexible screen disposed on the watch casing. The watch casing includes an end cover structure. The end cover structure includes a fixed portion and a slide-cover portion that is slidably connected to the fixed portion in a pulling fashion and capable of horizontally sliding out towards one side of the watch casing. An end surface of the slide-cover portion and an end surface of the fixed portion are disposed on the same plane or curved surface. The flexible screen includes a first part fixedly covering the end surface of the slide-cover portion and a second part normally wound on the other side of the watch casing by a winding mechanism. When the slide-cover portion slides out, the first part takes the second part out of the watch casing, such that the second part movably covers the end surface of the fixed portion to expand the display area of the display screen.

However, it is inconvenient to unfold or fold the flexible screen simply by pushing the slide-cover portion by hand, which adversely affects the user experience.

The embodiments of the present disclosure provide a wearable device in which a sliding display apparatus has the function of automatic folding when turned off.

Figure 2:
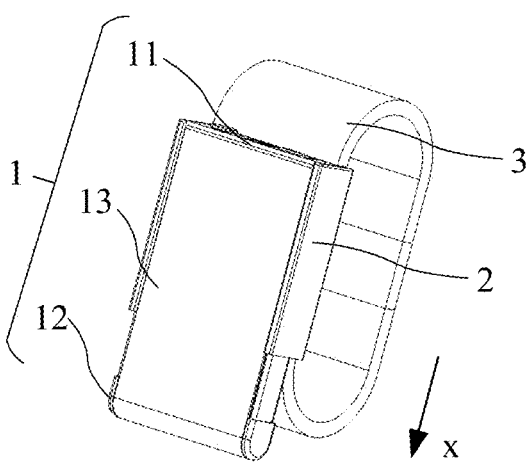
FIG. 2 is a schematic structural diagram of a wearable device in an unfolded state according to some embodiments of the present disclosure.

FIG. 1 and FIG. 2 are schematic structural diagrams of a wearable device in a folded state and an unfolded state according to some embodiments of the present disclosure. As shown in FIG. 1 and FIG. 2, the wearable device includes a sliding display apparatus 1, a base 2, and a watchband 3.

The sliding display apparatus 1 is connected to the base 2, and two ends of the watchband 3 are connected to the base 2.

Figure 3:
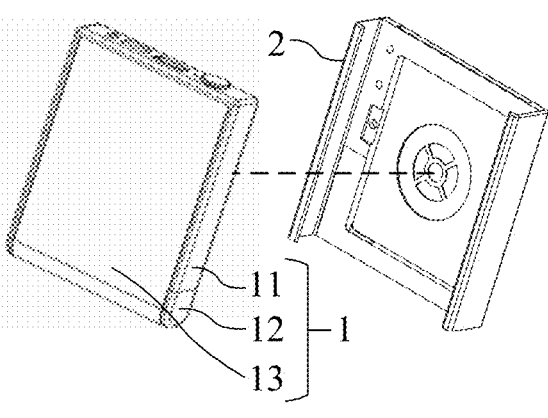
FIG. 3 is a schematic structural diagram of a sliding display apparatus and a base according to some embodiments of the present disclosure.

FIG. 3 is a schematic structural diagram of a sliding display apparatus and a base according to some embodiments of the present disclosure. Referring to FIGS. 1 to 3, the sliding display apparatus 1 includes a fixed portion 11, a movable portion 12, a flexible display panel 13, and a connecting assembly 14 (shown in FIG. 4). The fixed portion 11 is connected to the base 2. The movable portion 12 is connected to the fixed portion 11. A part of the flexible display panel 13 is connected to the fixed portion 11, and another part of the flexible display panel 13 is connected to the movable portion 12. The movable portion 12 can slide in a first direction x relative to the fixed portion 11, so as to drive the flexible display panel to unfold or fold, which realizes enlargement or reduction of the display area of the wearable device.

Optionally, when the wearable device is in a folded state, the length-width ratio of the display area of the flexible display panel 13 may be 4:3; and when the wearable device is in an unfolded state, the length-width ratio of the display area of the flexible display panel 13 may be 16:9, 18:9, 21:9, or the like. When the wearable device is in the folded state and the unfolded state, the length-width ratio of the display area of the flexible display panel 13 may be set according to actual needs, which is not limited in the embodiments of the present disclosure.

Figure 4:
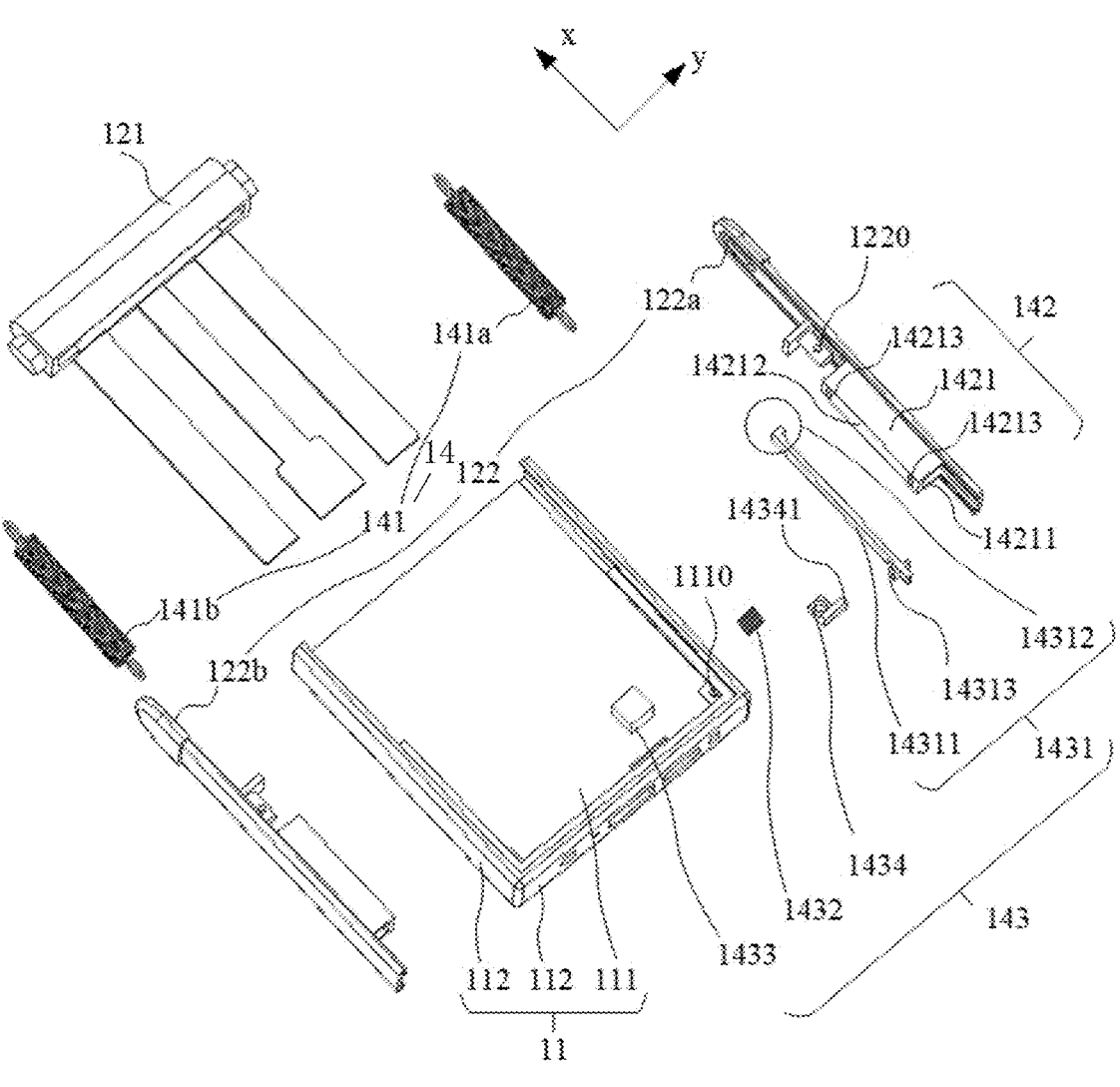
FIG. 4 is a schematic diagram of an internal structure of a sliding display apparatus according to some embodiments of the present disclosure.
Figure 5:
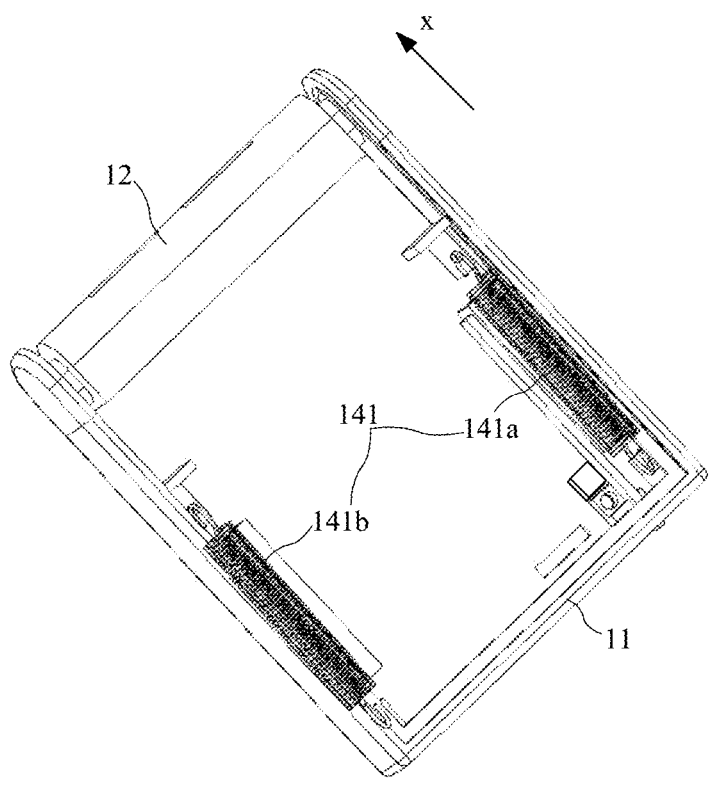
FIG. 5 is a schematic diagram of a sliding display apparatus in a folded state according to some embodiments of the present disclosure.
Figure 6:
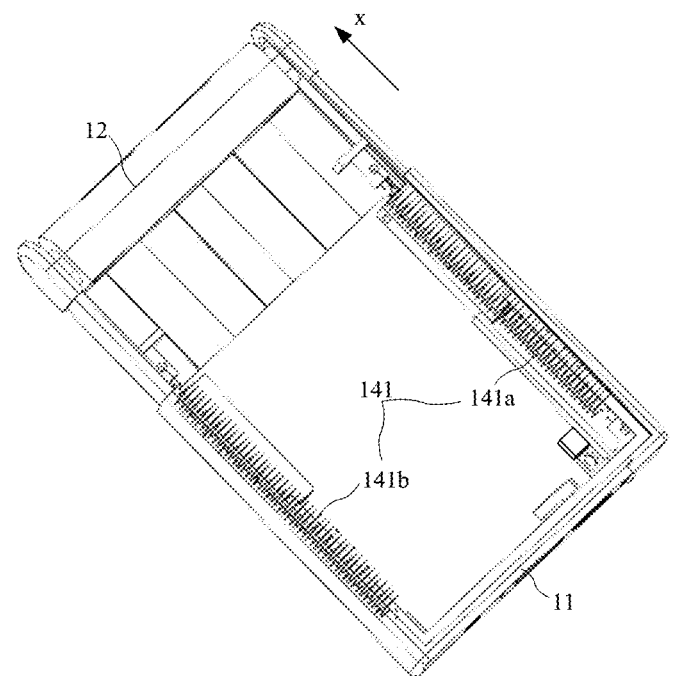
FIG. 6 is a schematic diagram of a sliding display apparatus in an unfolded state according to some embodiments of the present disclosure.

FIG. 4 is a schematic diagram of an internal structure of a sliding display apparatus according to some embodiments of the present disclosure. FIG. 5 and FIG. 6 are schematic diagrams of a sliding display apparatus in a folded state and an unfolded state according to some embodiments of the present disclosure. As shown in FIGS. 4 to 6, the connecting assembly 14 includes an elastic connector 141, and the elastic connector 141 is connected between the fixed portion 11 and the movable portion 12. The elastic connector 141 is configured to provide an acting force for urging the movable portion 12 and the fixed portion 11 to approach each other in the first direction x. Compared with unfolding or folding the flexible display panel 13 by simply pushing the movable portion by hand, the elastic connector 141 is provided to provide part or all of the acting force during relative folding of the fixed portion 11 and the movable portion 12, thus reducing the difficulty and complexity of a user's operation. In a possible embodiment, as shown in FIGS. 4 to 6, in the sliding display apparatus 1, the connecting assembly 14 includes two elastic connectors, namely, an elastic connector 141a and an elastic connector 141b, which are arranged opposite to each other.

The technical solution provided by the present disclosure at least has the beneficial effects that the elastic connector is arranged between the fixed portion and the movable portion and connects the fixed portion to the movable portion, and the elastic connector provides an acting force for urging the movable portion and the fixed portion to approach each other in the first direction, such that the wearable device has the function of automatic folding when turned off, achieving favorable user experience.

Exemplarily, the elastic connector 141 is an extension spring. For the connecting assembly including a compression spring, it is necessary to additionally provide some more complicated limiting structures to provide a compressive force, which usually takes up a large space. Compared with the connecting assembly including the compression spring, the connecting assembly including the extension spring occupies a smaller space and is suitable for small-sized wearable devices.

Optionally, the extension spring is a medium-light load spring. The elastic force of the medium-light load spring is not so large as to cause collision damage during relative folding of the fixed portion 11 and the movable portion 12; and the elastic force of the medium-light load spring is not so small as to fail to achieve the effect of realizing relative folding of the fixed portion 11 and the movable portion 12 by reducing or even removing manpower.

Exemplarily, the maximum load of a single extension spring in the embodiment of the present disclosure is 5 N to 9 N.

Exemplarily, the relative angle of hooks at two ends of the extension spring is 90° or 180°.

Figure 7:
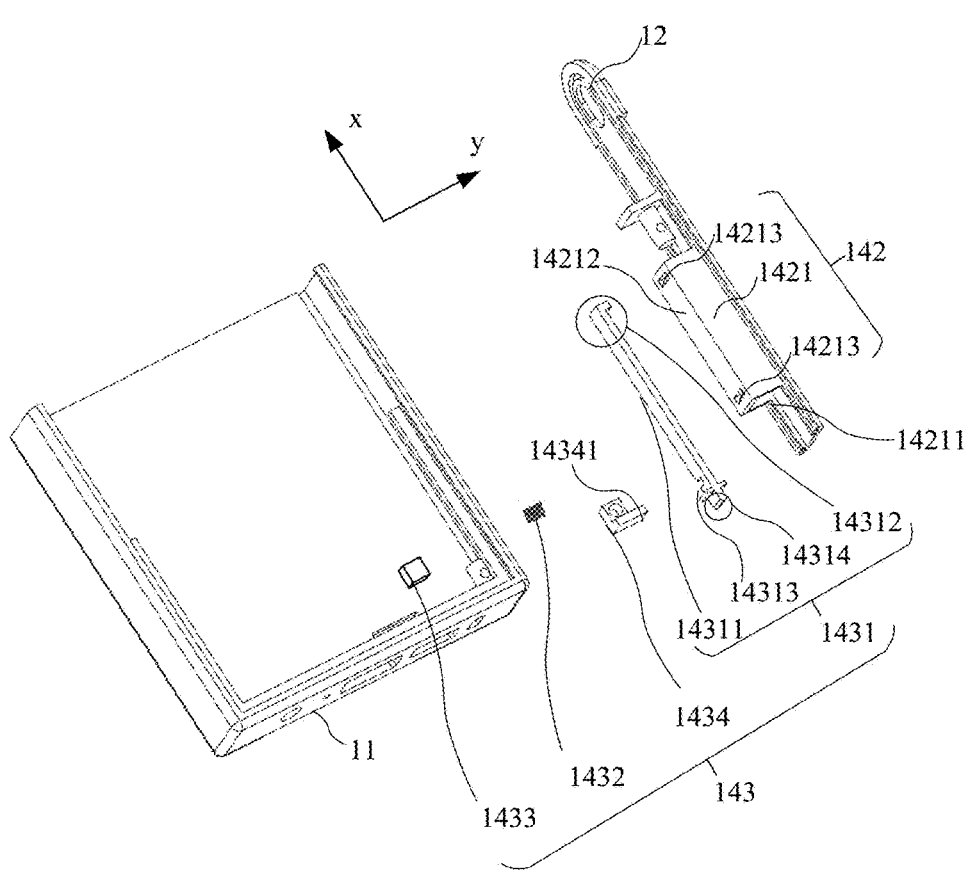
FIG. 7 is a partial schematic diagram of an internal structure of a sliding display apparatus according to some embodiments of the present disclosure.
Figure 8:
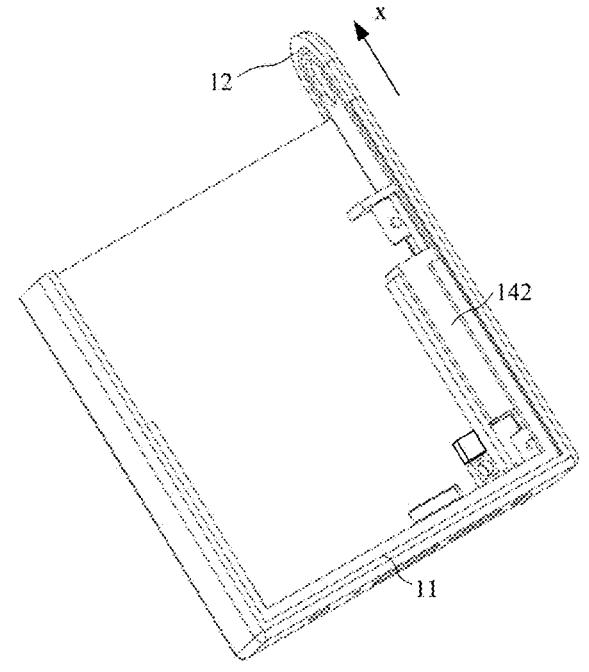
FIG. 8 is a partial schematic structural diagram of a sliding display apparatus in a folded state according to some embodiments of the present disclosure.
Figure 9:
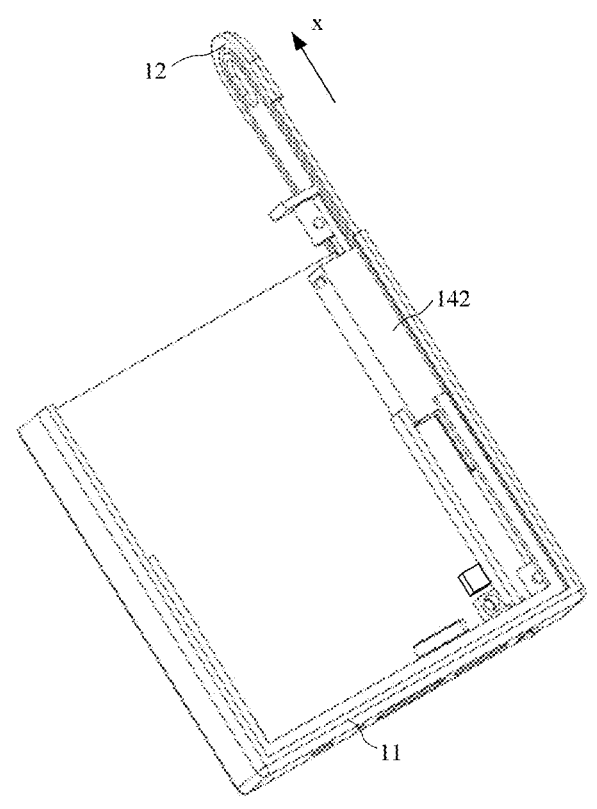
FIG. 9 is a partial schematic structural diagram of a sliding display apparatus in an unfolded state according to some embodiments of the present disclosure.

FIG. 7 is a partial schematic diagram of an internal structure of a sliding display apparatus according to some embodiments of the present disclosure. FIGS. 8 and 9 are partial structural diagrams of a sliding display apparatus in a folded state and an unfolded state according to some embodiments of the present disclosure. As shown in FIGS. 7 to 9, the connecting assembly 14 further includes a limiting structure 142, and the limiting structure 142 is connected to at least one of the movable portion 12 and the fixed portion 11. As shown in FIGS. 7 to 9, the limiting structure 142 is connected to the movable portion 12. The limiting structure 142 is configured to limit the position of the elastic connector 141 in a direction other than the first direction x. The limiting structure 142 is provided to limit the freedom of movement of the elastic connector 141 to 1, and the elastic connector 141 can only be extended or shortened in the first direction x, such that a sliding position deviation between the movable portion 12 and the fixed portion 11 caused by deviation of the elastic connector 141 can be reduced as much as possible, which improves the reliability of movement of the sliding display apparatus 1 switched between the folded state and the unfolded state.

In the embodiments of the present disclosure, referring to FIG. 4 or FIG. 7 again, the limiting structure 142 includes a bump 1421, the bump 1421 is connected to the movable portion 12, the bump 1421 is provided with a limiting channel 14211 therein, and the middle part of the elastic connector 141 is disposed in the limiting channel 14211, such that the elastic connector 141 can only move in the limiting channel 14211; and an extension direction of the limiting channel 14211 is the first direction x, such that the elastic connector 141 can only move in the first direction x.

It should be noted that, to clearly illustrate the state of the elastic connector 141 when the sliding display apparatus is in the folded state and the unfolded state, it seems that the elastic connector 141 in the embodiment shown in FIGS. 5 and 6 is not disposed in the limiting channel 14211, but actually the middle part of the elastic connector 141 is still disposed in the limiting channel 14211.

In another possible embodiment, the limiting structure 142 is connected to the fixed portion 11 and is not connected to the movable portion 12. The limiting structure 142 includes a bump 1421, and the bump 1421 is connected to the fixed portion 11. The bump 1421 is provided with a limiting channel 14211 therein, an extension direction of the limiting channel 14211 is the first direction x, and the middle part of the elastic connector 141 is disposed in the limiting channel 14211.

Optionally, the shape of the bump 1421 is a cylindrical structure having a hollow channel, and the cross-section of the cylindrical structure may be a circle, a triangle, a quadrangle, and the like.

In another possible embodiment, a part of the limiting structure 142 is connected to the fixed portion 11, another part is connected to the movable portion 12, and these two parts of the limiting structure 142 together form the limiting channel to limit the freedom of movement of the elastic connector 141 to 1, such that the elastic connector 141 can only be extended or shortened in the first direction x. For example, the part of the limiting structure 142 connected to the fixing portion 11 is a first strip-shaped baffle, a length direction of which is the first direction x, and a width direction of which is the thickness direction of the sliding display apparatus; and the part of the limiting structure 142 connected to the movable portion 12 is a second strip-shaped baffle, a length direction of which is the first direction x, and a width direction of which is a second direction y. The first strip-shaped baffle, the second strip-shaped baffle, the fixed portion 11, and the movable portion 12 form the limiting channel. Here, the second direction y is perpendicular to the first direction x, and is also perpendicular to the thickness direction of the sliding display apparatus.

In the embodiments of the present disclosure, a first surface 14212 of the bump 1421 is provided with at least two limiting holes 14213, and the at least two limiting holes 14213 are arranged in the first direction x. As shown in FIG. 7, the first surface 14212 of the bump 1421 is provided with two limiting holes 14213. The first surface 14212 is one of a plurality of surfaces of the bump 1421 proximal to the center of the wearable device. Here, the at least two limiting holes 14213 respectively correspond to the folded state, the unfolded state, and the state between the folded state and the unfolded state of the fixed portion 11 and the movable portion 12.

Exemplarily, as shown in FIG. 4 or FIG. 7, the connecting assembly 14 further includes a hovering assembly 143, the hovering assembly 143 is disposed on the fixed portion 11, and the hovering assembly 143 is configured to be operatively snapped into one of the at least two limiting holes 1421. Therefore, when a user stops operating by hand, the wearable device may also be kept in a folded state, or an unfolded state, or a state between the folded state and the unfolded state, which is suitable for various use scenarios and meets the operating habits of different users.

Exemplarily, as shown in FIG. 4 or FIG. 7, the hovering assembly 143 includes a first clamping member 1431, an elastic resetting member 1432, and a supporting member 1433. A first end of the first clamping member 1431 is provided with a baffle 14312 matching the limiting hole 14213, and the first clamping member 1431 is disposed in the fixed portion 11. A second end of the first clamping member 1431 is disposed outside the fixed portion 11, the supporting member 1433 is disposed in the fixed portion 11 and on the side of the first clamping member 1431 distal from the bump 1421, and the supporting member 1433 is connected to the fixed portion 11. One end of the elastic resetting member 1432 is disposed in the supporting member 1433, and another end of the elastic resetting member 1432 abuts against the first clamping member 1431 and is configured to provide pressure for limiting the baffle in the limiting hole 14213. The first clamping member 1431 matches the limiting hole 1421, and the first clamping member 1431 is snapped into the limiting hole 1421 under the action of the elastic resetting member 1432 and the supporting member 1433.

In a possible embodiment, the hovering assembly further includes a second clamping member 1434, the second clamping member 1434 is disposed in the fixed portion 11 and on the side of the first clamping member 1431 distal from the bump 1421, and the second clamping member 1434 is connected to the fixed portion 11. The first clamping member 1431 is provided with a clamping slot 14313 therein, the clamping slot 14313 is disposed on the surface of the first clamping member 1431 proximal to the second clamping member 1434 and is proximal to the second end. The second clamping member 1434 is configured to be disposed in the clamping slot 14313 when the baffle 14312 is located outside the limiting hole 14213, to fix the first clamping member 1431 and thus prevent the first clamping member from falling off.

In a possible embodiment, as shown in FIG. 4 or FIG. 7, the first clamping member 1431 includes a first rod 14311 and a baffle 14312 connected to each other, the baffle 14312 is disposed at one end of the first rod 14311, the baffle 14312 matches the limiting hole 14213, and another end of the first rod 14311 is disposed on the outer side of the fixing portion 11. Here, the part of the first rod 14311 located on the outer side of the fixed portion 11 is also called a state-switching toggle 14314. The second clamping member 1434 includes a second limiting baffle 14341, the second clamping member 1434 is connected to the fixed portion 11, the first rod 14311 is provided with a clamping slot 14313 on the part disposed on the inner side of the fixed portion 11 and on the side distal from the baffle 14312, and the second limiting baffle 14341 matches the clamping slot 14313. The elastic resetting member 1432 is a spring. The supporting member 1433 is disposed in the area from the first rod 14311 to the center of the wearable device. One end of the elastic resetting member 1432 abuts against the first rod 14311.

Referring to FIGS. 7 to 9, the supporting member 1433 is fixedly connected with the fixed portion 11, for example, by a screw. When the wearable device is in the folded state shown in FIG. 8, the second limiting baffle 14341 is snapped into the clamping slot 14313; the baffle 14312 is snapped into the limiting hole 14213 distal from the state-switching toggle 14314. At this time, the elastic force of the elastic resetting member 1432 exerts an acting force in the second direction y, from the first rod 14311 to the bump 1421, onto the first rod 14311, such that the baffle 14312 is firmly snapped into the limiting hole 14213 distal from the state-switching toggle 14314 and does not come out easily.

When the wearable device needs to be unfolded, the state-switching toggle 14314 is moved from the position proximal to the bump 1421 to the position distal from the bump 1421, the elastic resetting member 1432 is squeezed, and the baffle 14312 and the limiting hole 14213 distal from the state-switching toggle 14314 change from an engaged state to a disengaged state, i.e., the baffle 14312 is disengaged from the limiting hole 14213 distal from the state-switching toggle 14314. At this time, the movable portion 12 slides relative to the fixed portion 11. When the movable portion slides to cause the baffle 14312 to be in contact with the other limiting hole 14213 proximal to the state-switching toggle 14314, the elastic force of the elastic resetting member 1432 exerts an acting force in the second direction y, from the first rod 14311 to the bump 1421, onto the first rod 14311, such that the state-switching toggle 14314 is driven to return from the position distal from the bump 1421 to the position proximal to the bump 1421, and the baffle 14312 is firmly snapped into this limiting hole 14213 and does not come out easily. In this way, the wearable device is kept in a relatively unfolded state.

When the wearable device needs to be tightened, the state-switching toggle 14314 is moved from the position proximal to the bump 1421 to the position distal from the bump 1421 again, the elastic resetting member 1432 is squeezed, and the baffle 14312 and the limiting hole 14213 proximal to the state-switching toggle 14314 change from the engaged state to the disengaged state, i.e., the baffle 14312 is disengaged from the limiting hole 14213 proximal to the state-switching toggle 14314. At this time, the movable portion 12 may slide relative to the fixed portion 11. When the movable portion slides to cause the baffle 14312 to be in contact with the other limiting hole 14213 distal from the state-switching toggle 14314, the elastic force of the elastic resetting member 1432 exerts an acting force in the second direction y, from the first rod 14311 to the bump 1421, onto the first rod 14311, such that the state-switching toggle 14314 is driven to return from the position distal from the bump 1421 to the position proximal to the bump 1421, and the baffle 14312 is firmly snapped into this limiting hole 14213 and does not come out easily. In this way, the wearable device is kept in a relatively tightened state.

According to the embodiments of the present disclosure, in the embodiment shown in FIGS. 4 to 7, in the sliding display apparatus 1, the connecting assembly 14 includes two elastic connectors arranged opposite to each other, namely an elastic connector 141a and an elastic connector 141b. In a possible embodiment, the sliding display apparatus 1 includes one hovering assembly 143, and the hovering assembly 143 is connected to the elastic connector 141b; alternatively, as shown in FIGS. 4 to 7, the hovering assembly 143 is connected to the elastic connector 141a. In another possible embodiment, the sliding display apparatus 1 includes two hovering assemblies 143 arranged opposite to each other and connected to the elastic connector 141a and the elastic connector 141b respectively.

According to the embodiments of the present disclosure, referring to FIG. 4 again, the fixed portion 11 includes a bottom plate 111 and a plurality of side walls 112 connected to the bottom plate 111. The movable portion 12 includes a main body 121 and two connecting arms 122, the two connecting arms 122 are a connecting arm 122a and a connecting arm 122b respectively connected to two ends of the main body 121. The two connecting arms 122 are parallel to each other. The main body 121 and the plurality of side walls 112 enclose an accommodating cavity, and the two connecting arms 122 are disposed in the accommodating cavity. The connecting arms 122 and the side walls 112 connected to the connecting arms 122 are in sliding fit. The side wall 112 connected to the connecting arm 122 is provided with a chute, and a part of the connecting arm 122 is disposed in the chute; alternatively, the connecting arm 122 is provided with a chute, the side wall 112 connected to the connecting arm 122 is provided with a raised structure, and the raised structure is disposed in the chute. An extension direction of the chute is the first direction x.

Various structural members can be arranged in the accommodating cavity, and the elastic connector 141, the limiting structure 142, and the hovering assembly 143 are all disposed in the accommodating cavity. In a possible embodiment, as shown in FIG. 4, two ends of the elastic connector 141 are connected to the bottom plate 111 and the connecting arm 122 respectively, the limiting structure 142 is disposed on the connecting arm 122, and the supporting member 1433 and the second clamping member 1434 of the hovering assembly 143 are connected to the bottom plate 111.

Exemplarily, referring to FIG. 4 again, the fixed portion 11 includes three side walls 112. Each of the two connecting arms 122 is provided with one first connecting hole 1220, and the bottom plate 111 of the fixed portion 11 is provided with two second connecting holes 1110 respectively proximal to the two connecting arms 122. The two ends of the elastic connector 141 are connected to the movable portion 12 and the fixed portion 11 through the first connecting hole 1220 and the second connecting hole 1110 respectively.

Figure 10:
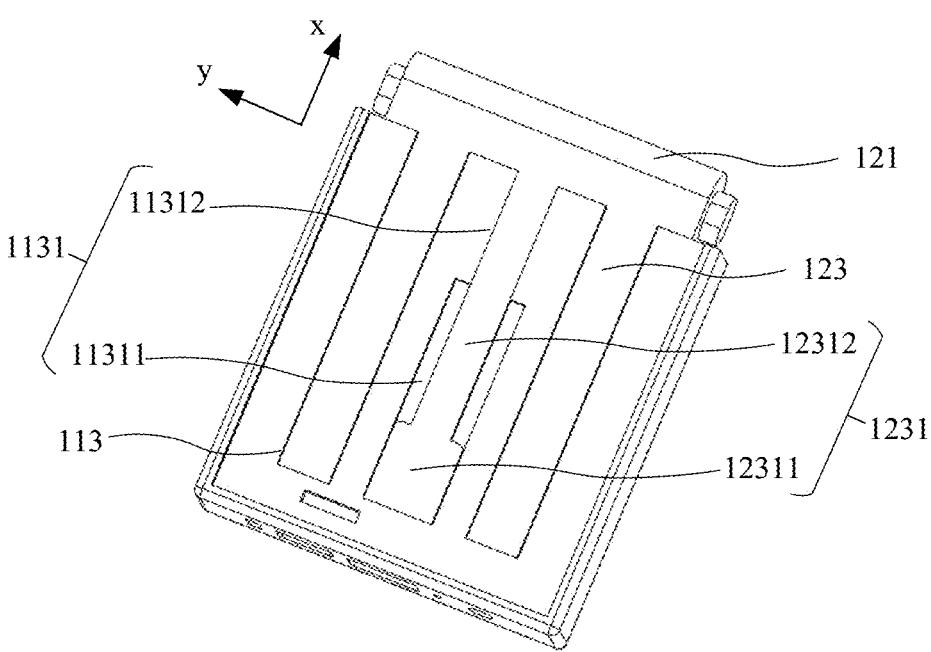
FIG. 10 is a schematic structural diagram of a sliding display apparatus in a folded state according to some embodiments of the present disclosure.
Figure 11:
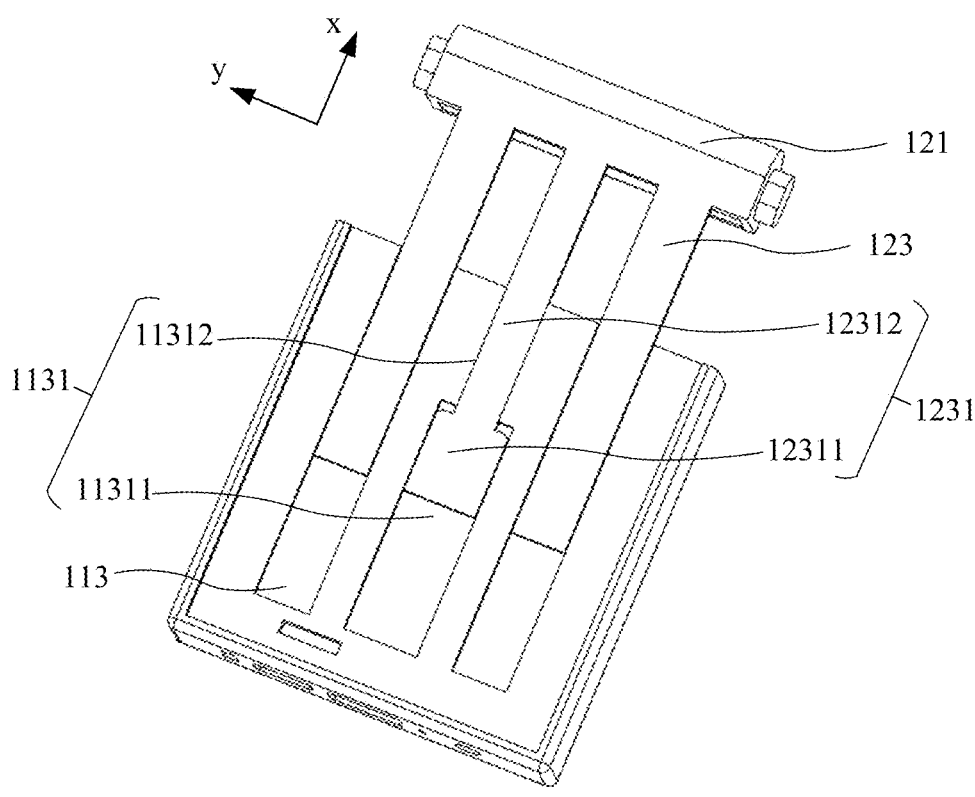
FIG. 11 is a schematic structural diagram of a sliding display apparatus in an unfolded state according to some embodiments of the present disclosure.

FIG. 10 and FIG. 11 are schematic structural diagrams of a sliding display apparatus in a folded state and an unfolded state respectively according to some embodiments of the present disclosure. As shown in FIG. 10 and FIG. 11, the movable portion 12 further includes a plurality of comb teeth 123, the plurality of comb teeth 123 are connected to the main body 121, the plurality of comb teeth 123 are arranged in the second direction y, and the second direction y is perpendicular to the first direction and parallel to the bottom plate 111. The bottom plate 111 is provided with a plurality of chutes 113, and the plurality of chutes 113 are arranged in the second direction y. The plurality of comb teeth 123 and the plurality of chutes 113 are staggered and meshed with each other, and the plurality of comb teeth 123 may slide in the chutes 113 in the first direction x. The structure that the comb teeth match the chutes not only facilitates sliding of the movable portion 12 relative to the fixed portion 11, but also makes the movable portion 12 slide only in the first direction x relative to the fixed portion 11.

The plurality of comb teeth 123 include at least one clamping comb tooth 1231, the dimension of a first part 12311 of the clamping comb tooth 1231 in the second direction y is larger than that of a second part 12312 of the clamping comb tooth 1231 in the second direction, and the first part 12311 of the clamping comb tooth 1231 is disposed on the side of the second part 12312 of the clamping comb tooth 1231 distal from the main body 121. Correspondingly, the plurality of chutes 113 include at least one clamping chute 1131, the dimension of a first part 11311 of the clamping chute 1131 in the second direction is larger than that of a second part 11312 of the clamping chute 1131 in the second direction y, and the first part 11311 of the clamping chute 1131 is disposed on the side of the second part 11312 of the clamping chute 1131 distal from the main body 121. The clamping comb teeth 1231 and the clamping chute 1131 where the clamping comb teeth 1231 are disposed cooperate with each other to limit the maximum sliding distance of the plurality of comb teeth 123 relative to the plurality of chutes 113 in the first direction x. The clamping comb teeth 1231 and the clamping chute 1131 are provided to prevent the movable portion 12 from sliding out an excessive distance relative to the fixed portion 11, resulting in damage to the sliding display apparatus 1.

Optionally, an elastic stopper is arranged at the tail end of the chute 113 to reduce wear between the comb teeth 123 and the chutes 113 and to improve the durability of the mechanism.

Figure 12:
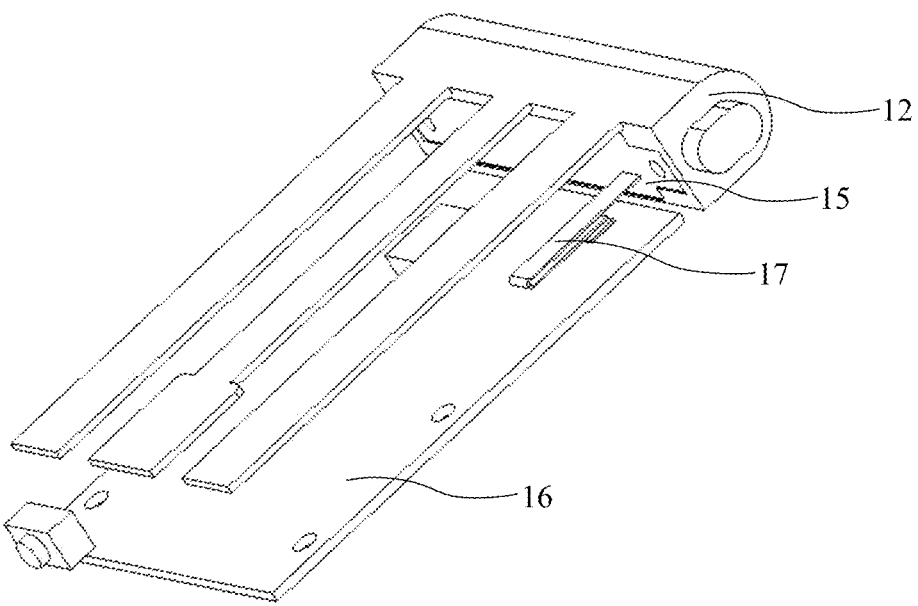
FIG. 12 is a schematic diagram of an internal structure of a sliding display apparatus according to some embodiments of the present disclosure.

FIG. 12 is a schematic diagram of an internal structure of a sliding display apparatus according to some embodiments of the present disclosure. As shown in FIG. 12, the sliding display apparatus 1 includes a first electronic device 15, a first circuit board 16, and a first flexible connector 17. The first electronic device 15 is connected to the movable portion 12, the first circuit board 16 is connected to the fixed portion 11 (not shown in FIG. 12), and the first flexible connector 17 connects the first electronic device 15 to the first circuit board 16. During the use of the wearable device, the first electronic device 15 and the first circuit board 16 move relative to each other. Optionally, the first flexible connector 17 has high elasticity to avoid breakage during the use of the wearable device and to ensure the electrical connection between the first electronic device 15 and the first circuit board 16.

Exemplarily, the first electronic device 15 is a speaker component. The speaker component may output sound.

Optionally, the first electronic device 15 and the movable portion 12 are fixedly connected by a screw.

Figure 13:
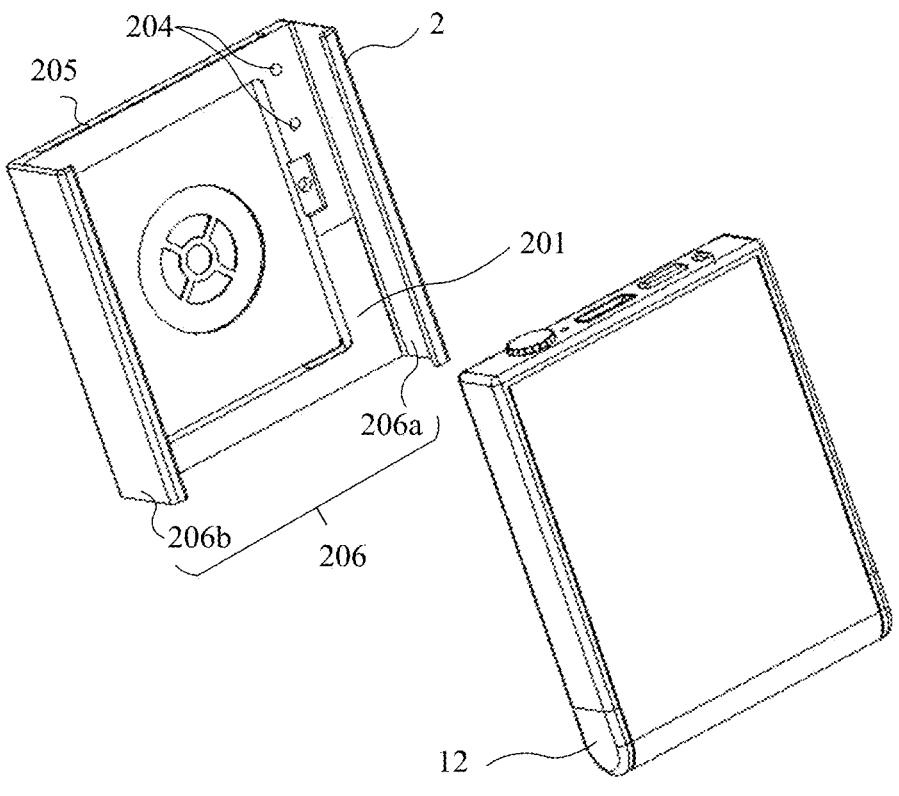
FIG. 13 is a schematic diagram of an internal structure of a wearable device according to some embodiments of the present disclosure.

FIG. 13 is a schematic diagram of an internal structure of a wearable device according to some embodiments of the present disclosure. As shown in FIG. 13, the base 2 includes a substrate 205 and two side walls 206, namely a side wall 206a and a side wall 206b, the two side walls 206 are disposed on two opposite sides of the substrate 205 and connected to the substrate 205, and a first surface of the substrate 205 is provided with a first groove 201, such that a gap exists between the movable portion 12 and the first surface, and the first surface is disposed between the two side walls 206. The fixed portion 11 and the movable portion 12 are disposed on the first surface and between the two side walls 206. The first groove is provided to reduce screen wear caused by the friction between the sliding display apparatus 1 and the base 2, and reduce the sliding resistance of the movable portion 12 relative to the fixed portion 11. Exemplarily, the sliding display apparatus 1 and the base 2 are fixed by locking the screw 204 at the bottom.

Exemplarily, the gap between the movable portion 12 and the first surface is 0.1 mm to 0.2 mm. For example, the gap is 0.1 mm, 0.12 mm, 0.14 mm, 0.16 mm, 0.18 mm, or 0.2 mm.

Figure 14:
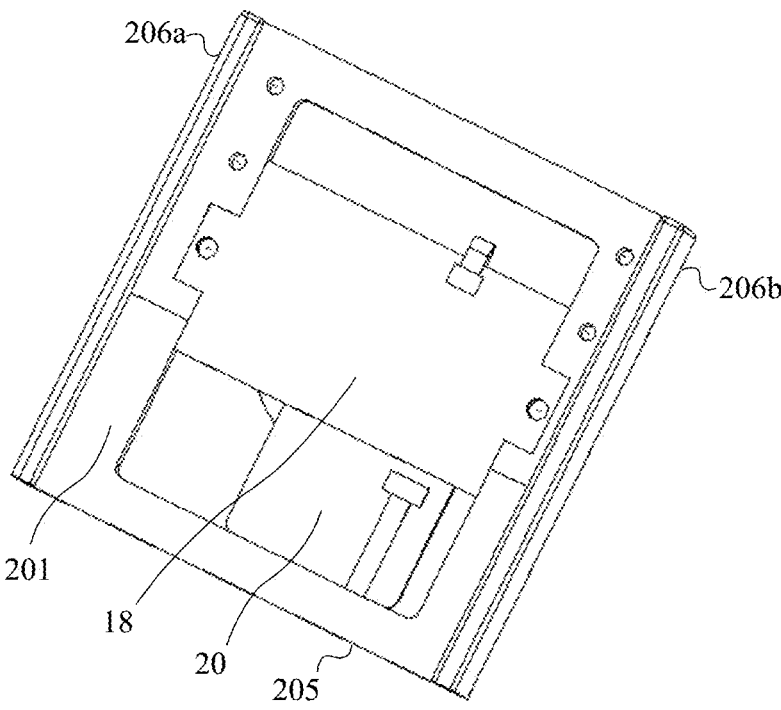
FIG. 14 is a schematic diagram of an internal structure of a wearable device according to some embodiments of the present disclosure.
Figure 15:
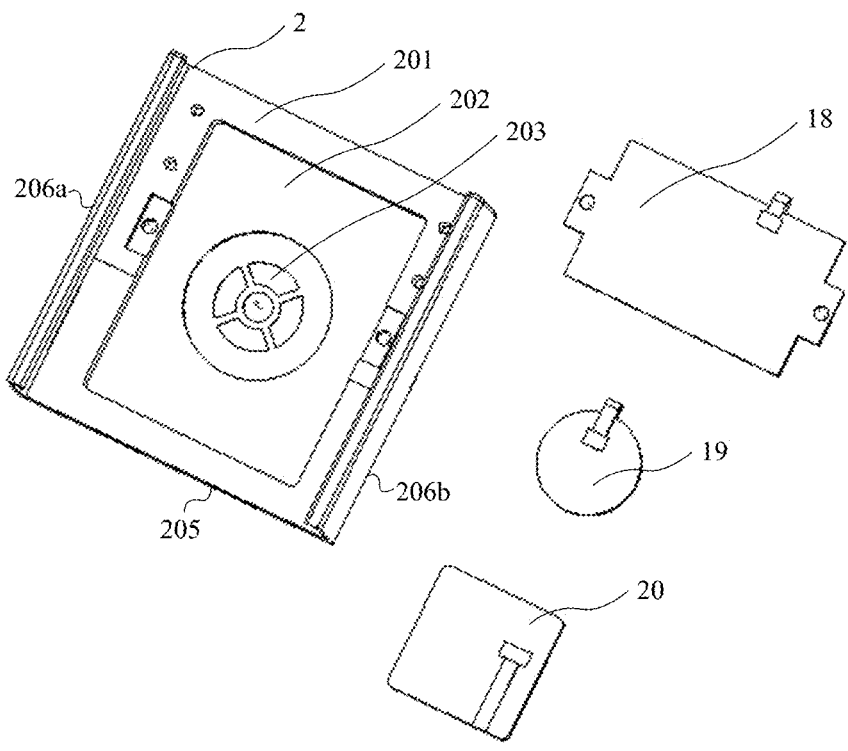
FIG. 15 is a schematic diagram of an internal structure of a wearable device according to some embodiments of the present disclosure.

FIG. 14 and FIG. 15 are schematic diagrams of an internal structure of a wearable device according to some embodiments of the present disclosure. As shown in FIG. 14 and FIG. 15, the first surface of the substrate 205 is further provided with a second groove 202 in a direction proximal to the sliding display apparatus 1, and the second groove 202 is communicated with the first groove 201. The second groove 202 is configured to receive an electronic device. The sliding display apparatus 1 further includes a second circuit board 18 and a second electronic device, the second circuit board 18 and the second electronic device are both disposed in the second groove 202, the second circuit board 18 is connected to the base 2 and electrically connected with the first circuit board 16, and the second electronic device is electrically connected with the second circuit board 18.

The substrate 205 is provided with an opening 203, and the opening 203 is disposed in the second groove 202. The second electronic device includes a health monitoring sensor 19, and the health monitoring sensor 19 is disposed at the opening 203. The second circuit board 18 is connected to the base 2, and the health monitoring sensor 19 is disposed on the side of the second circuit board 18 distal from the flexible display panel 13. Optionally, the second circuit board 18 is provided with two screw holes arranged in the second direction y, and the second circuit board 18 is connected to the base 2 by a screw. The sliding display apparatus 1 further includes a wireless charging coil 20, the wireless charging coil 20 is disposed in the second groove 202, and the wireless charging coil 20 is electrically connected with the second circuit board 18. As can be seen from FIG. 14 and FIG. 15, there is still plenty of room for placing other devices, such as sensors, shielding components, and antennas. The opening 203 helps to provide an electrode in contact with human skin, and helps to emit light to the outside of the wearable device herein and to receive the returned light through the opening 203. Here, the health monitoring sensor 19 includes at least one of a contact sensor and a non-contact sensor. The contact sensor includes but is not limited to a piezoelectric sensor and a piezoresistive sensor, and the non-contact sensor includes but is not limited to an optical sensor. The health monitoring sensor 19 is configured to monitor health information, and can detect information including, but not limited to, heart rate, pulse, and the like by the electrode arranged at the opening 203, or by emitting and receiving light at the opening 203.

Figure 16:
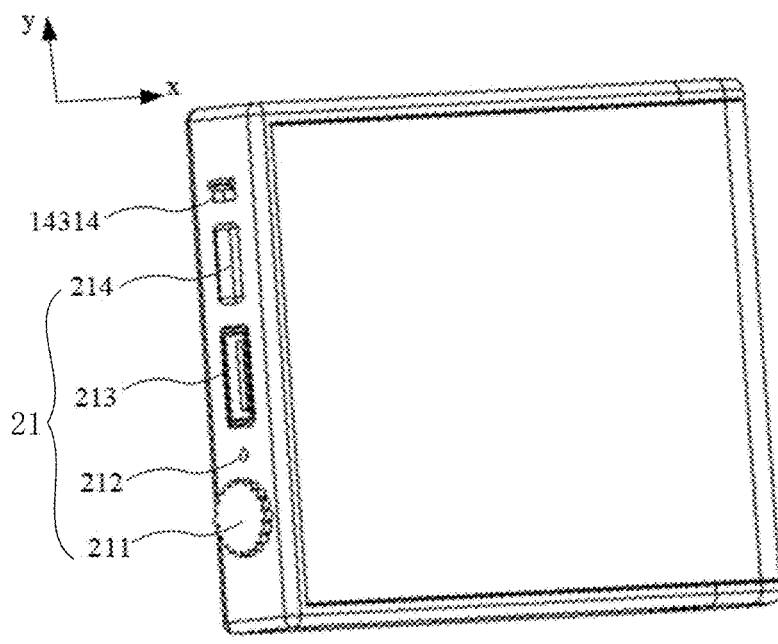
FIG. 16 is a schematic structural diagram of a sliding display apparatus according to some embodiments of the present disclosure.

In the embodiments of the present disclosure, referring to FIG. 16, the sliding display apparatus 1 further includes a third electronic device 21, and the third electronic device 21 is electrically connected with the first circuit board 16 and connected to the fixed portion 11. The third electronic device 21 includes at least one of a knob 211, a vibrating motor 216, a microphone component 212, a transmission interface 213, a key 214, and a battery block 215. Together with a rotation sensor, the knob 211 may be used for zooming the display screen, moving the screen up, and the like. The microphone component 212 may input sound and is connected to the first circuit board 16 by the flexible connector. The transmission interface 213 is welded onto a main logic board 310, and may be used for device charging and data transmission. For example, the transmission interface 213 is a Type-C interface. The key 214 may be used to serve the functions such as menu switching, background program wake-up, and mode switching, and is connected to the first circuit board 16 by the flexible connector. The battery block 215 provides power for the device, and is connected to the first circuit board 16 by the flexible connector, and the battery block 215 is secured to the fixed portion 11 through adhesive bonding. The vibrating motor 216 may give a notification, and to ensure the stability, it is necessary to fixedly connect the vibrating motor 216 to the fixed portion, for example, by a screw hole in the vibrating motor 216.

Figure 17:
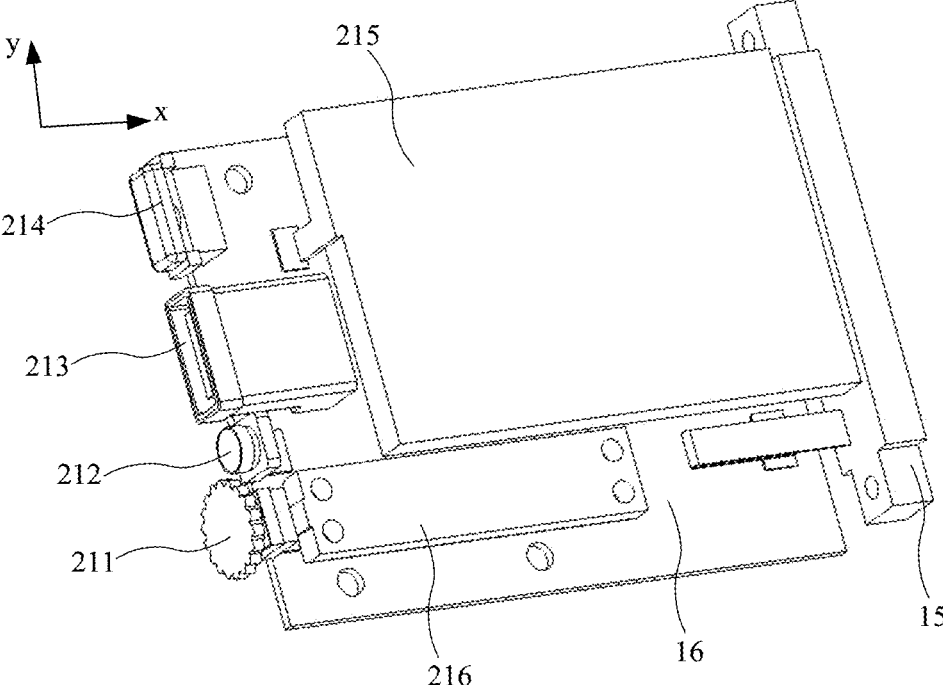
FIG. 17 is a schematic structural diagram of a sliding display apparatus according to some embodiments of the present disclosure.

FIG. 16 and FIG. 17 are schematic structural diagrams of a sliding display apparatus according to some embodiments of the present disclosure. As shown in FIG. 16 and FIG. 17, the knob 211, the microphone component 212, the transmission interface 213, and the key 214 are arranged in the second direction y. The knob 211 and the vibrating motor 216 are arranged in the first direction x. The battery block 215 is disposed on one side of the first circuit board 16.

Figure 18:
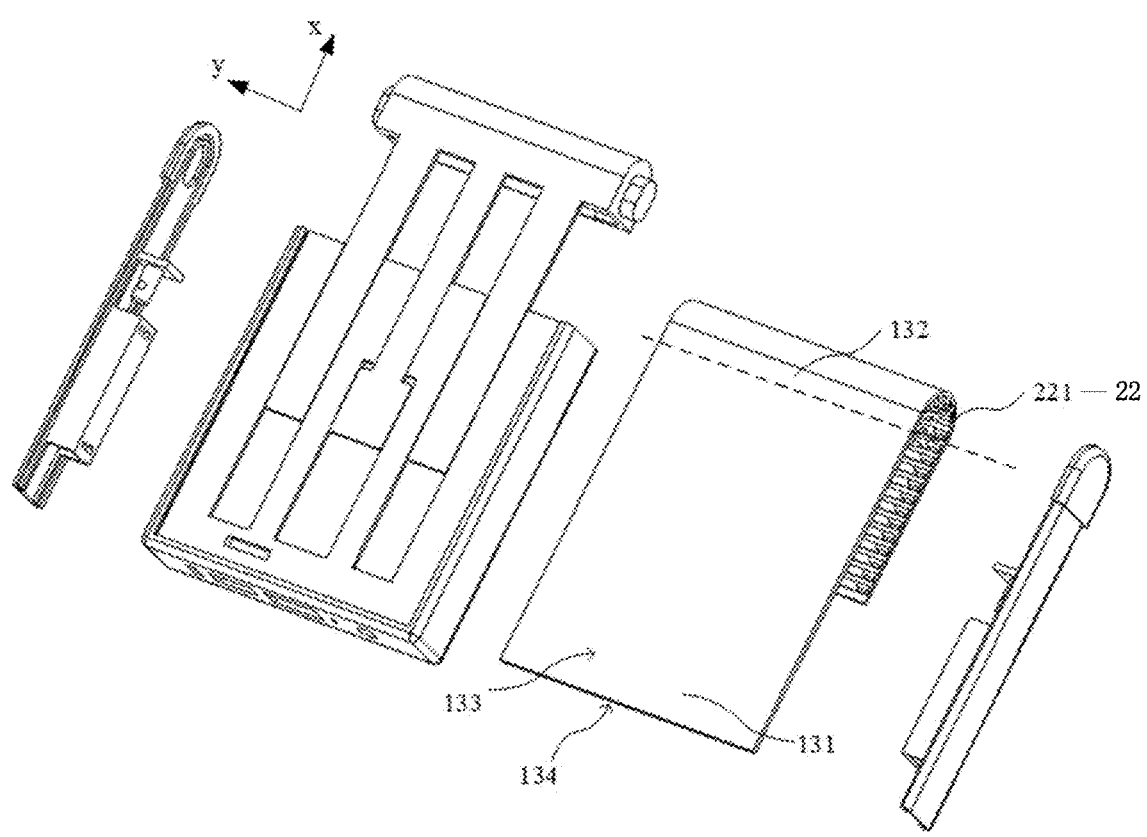
FIG. 18 is a schematic structural diagram of a sliding display apparatus according to some embodiments of the present disclosure.

FIG. 18 is a schematic structural diagram of a sliding display apparatus according to some embodiments of the present disclosure. As shown in FIG. 18, the flexible display panel 13 includes an adhesive fixing region 131 and a sliding region 132, the adhesive fixing region 131 is connected to the sliding region 132, the adhesive fixing region 131 is connected to the fixed portion 11, and the sliding region 132 is connected to the movable portion 12. The sliding display apparatus 1 further includes a supporting structure 22. The flexible display panel 13 is provided with a light-exiting surface 133, the supporting structure 22 is disposed in the sliding region 132 and on a back side 134 of the flexible display panel 13, and the back side 134 is a side opposite to the light-exiting surface 133. The supporting structure 22 includes a plurality of support bars 221, and the plurality of support bars 221 are arranged in the first direction x. In the movable portion 12, the two connecting arms 122 are provided with two rails respectively, and two ends of the plurality of support bars 221 match the two rails, such that the support bars 221 can slide along the rails. As the movable portion 12 slides relative to the fixed portion 11, the plurality of support bars 221 are driven to move on the rails, which in turn drives the flexible display panel 13 to be folded or unfolded.

Figure 19:
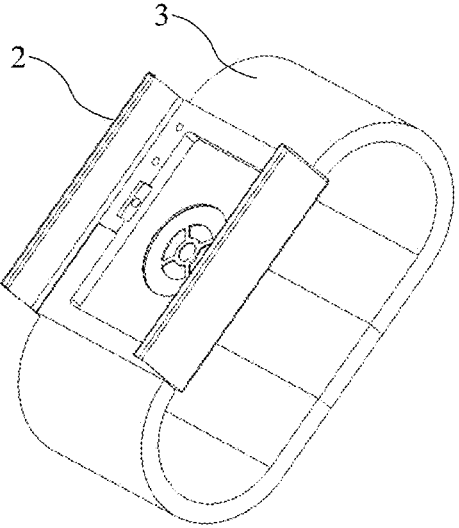
FIG. 19 is a schematic structural diagram of a wearable device according to some embodiments of the present disclosure.
Figure 20:
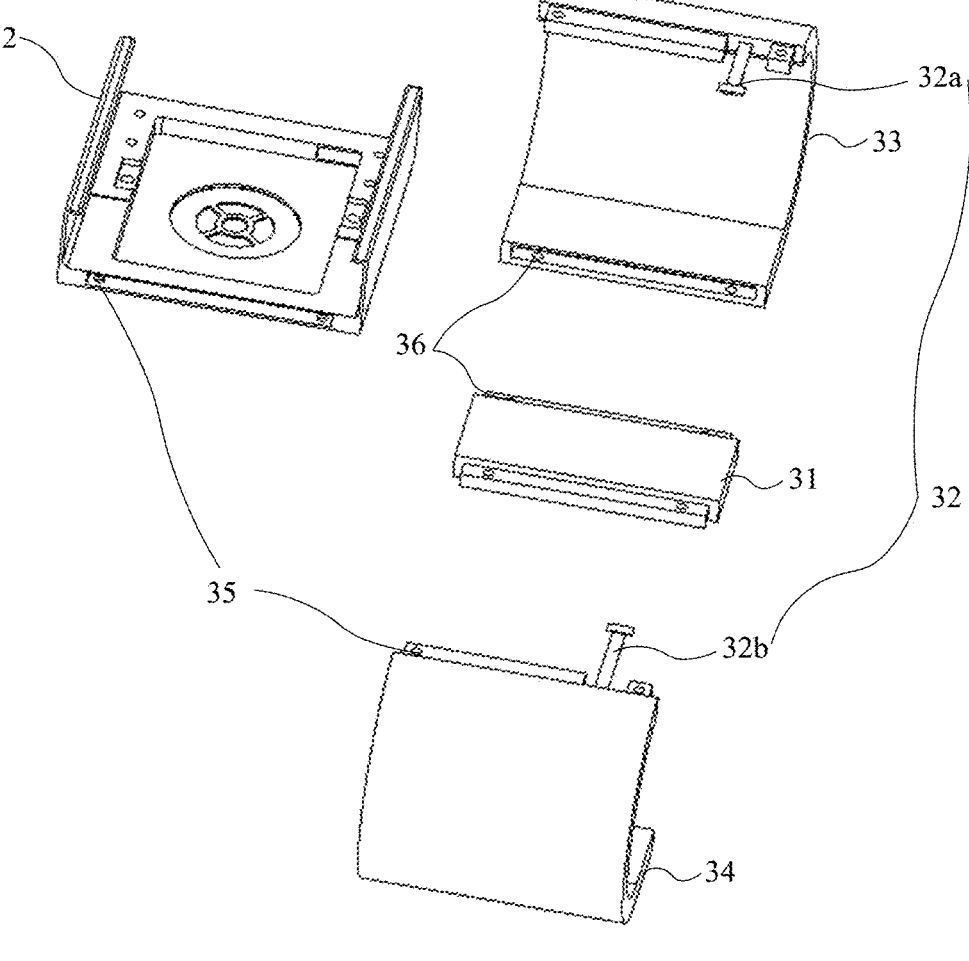
FIG. 20 is a schematic structural diagram of a wearable device according to some embodiments of the present disclosure.

FIG. 19 and FIG. 20 are schematic structural diagrams of a wearable device according to some embodiments of the present disclosure. As shown in FIG. 19 and FIG. 20, the watchband 3 includes a flexible battery and a battery output portion 32, and the flexible battery is electrically connected with the sliding display apparatus 1 by the battery output portion 32. The flexible battery on the watchband 3 may be electrically connected with the first circuit board 16, which increases the overall battery capacity and prolongs the overall battery life.

Exemplarily, as shown in FIG. 19 and FIG. 20, the watchband 3 includes a first part 33, a second part 34, and an elastic watchband connector 31, one end of the first part 33 and one end of the second part 34 are connected by the watchband connector 31, and another end of the first part 33 and another end of the second part 34 are connected to the base 2. The watchband connector 31 may make the wearable device adapt to the wrists of different people.

Optionally, the watchband 3 includes two battery output portions 32, namely, a battery output portion 32a and a battery output portion 32b, the battery output portion 32a is disposed in the first part 33, the battery output portion 32b is disposed in the second part 34.

Optionally, the first part 33 of the watchband and the base 2, and the second part 34 of the watchband and the base 2, are connected and fixed through first fixing holes 35.

Optionally, the watchband 3 is made of artificial leather, fluoro rubber, or genuine leather. The watchband connector 31 is made of rubber.

Optionally, the thickness of the watchband connector 31 is the same as that of the first part 33 or the second part 34 of the watchband; or the thickness of the watchband connector 31 is smaller than that of the first part 33 or the second part 34 of the watchband, and the thinned watchband connector 31 has better tensile property.

Optionally, the first part 33 of the watchband and the watchband connector 31, and the second part 34 of the watchband and the watchband connector 31, are connected and fixed through second fixing holes 36.

The embodiments of the present disclosure further provide a wearable device. The wearable device includes a sliding display apparatus 1, a base 2, and a watchband 3, the sliding display apparatus 1 is connected to the base 2, and two ends of the watchband 3 are connected to the base 2. The sliding display apparatus 1 includes a fixed portion 11, a movable portion 12, a flexible display panel 13, and a connecting assembly 14, the fixed portion 11 is connected to the base 2, and the fixed portion 11 includes a bottom plate 111 and a plurality of side walls 112 connected to the bottom plate 111. The movable portion 12 includes a main body 121 and two connecting arms 122, the two connecting arms 122 are connected to two ends of the main body 121, and the two connecting arms 122 are parallel to each other. The main body 121 and the plurality of side walls 112 enclose an accommodating cavity, the two connecting arms 122 are disposed in the accommodating cavity, and the connecting arm 122 is slideably connected with the side wall 112, such that the movable portion 12 may slide in a first direction relative to the fixed portion 11. A part of the flexible display panel 13 is connected to the fixed portion 11, and another part of the flexible display panel 13 is connected to the movable portion 12. The connecting assembly 14 includes an elastic connector 141, a limiting structure 142, and a hovering assembly 143. The elastic connector 141 is connected between the fixed portion 11 and the movable portion 12, and the elastic connector 141 is configured to provide an acting force for urging the movable portion 12 and the fixed portion 11 to approach each other in the first direction. The limiting structure 142 includes a bump 1421, the bump 1421 is connected to the connecting arm 122, the bump 1421 is provided with a limiting channel 14211 therein, an extension direction of the limiting channel 14211 is the first direction, the middle part of the elastic connector 141 is disposed in the limiting channel 14211, a first surface 14212 of the bump 1421 is provided with at least two limiting holes 14213, and the at least two limiting holes 14213 are arranged in the first direction. The hovering assembly 143 is disposed in the accommodating cavity and connected to the fixed portion 11, and the hovering assembly 143 is configured to be operatively snapped into at least one of the at least two limiting holes 14213.

Described above are merely optional embodiments of the present disclosure, and are not intended to limit the present disclosure. Within the spirit and principles of the present disclosure, any modifications, equivalent substitutions, improvements, and the like should fall within the scope of protection of the present disclosure.

What is claimed is:

1. A wearable device, comprising a sliding display apparatus, a base, and a watchband, wherein the sliding display apparatus is connected to the base, and two ends of the watchband are connected to the base; and the sliding display apparatus comprises a fixed portion, a movable portion, a flexible display panel, and a connecting assembly, wherein the fixed portion is connected to the base;

the movable portion is connected to the fixed portion, and the movable portion is slideable in a first direction relative to the fixed portion;

a part of the flexible display panel is connected to the fixed portion, and another part of the flexible display panel is connected to the movable portion; and the connecting assembly comprises an elastic connector and a limiting structure, wherein the elastic connector is connected between the fixed portion and the movable portion and configured to provide an acting force for urging the movable portion and the fixed portion to approach each other in the first direction, the limiting structure is connected to at least one of the movable portion and the fixed portion and is configured to limit a position of the elastic connector in a direction other than the first direction; and the elastic connector is an extension spring.

2. The wearable device according to claim 1, wherein the limiting structure comprises a bump, wherein the bump is connected to the movable portion and is provided with a limiting channel therein, an extension direction of the limiting channel being the first direction, and a middle part of the elastic connector being disposed in the limiting channel.

3. The wearable device according to claim 2, wherein a first surface of the bump is provided with at least two limiting holes, the at least two limiting holes being arranged in the first direction; and the connecting assembly further comprises a hovering assembly, the hovering assembly being disposed on the fixed portion and configured to be operatively snapped into one of the at least two limiting holes.

4. The wearable device according to claim 3, wherein the hovering assembly comprises a first clamping member, an elastic resetting member, and a supporting member;

wherein a first end of the first clamping member is provided with a baffle matching the limiting hole and is disposed in the fixed portion, and a second end of the first clamping member is disposed outside the fixed portion;

the supporting member is disposed in the fixed portion, is on a side of the first clamping member distal from the bump, and is connected to the fixed portion; and one end of the elastic resetting member is disposed in the supporting member, and another end of the elastic resetting member abuts against the first clamping member and is configured to provide pressure for limiting the baffle in the limiting hole.

5. The wearable device according to claim 4, wherein the hovering assembly further comprises a second clamping member, wherein the second clamping member is disposed in the fixed portion, is on a side of the first clamping member distal from the bum, and is connected to the fixed portion;

the first clamping member is provided with a clamping slot therein, the clamping slot being disposed on a surface of the first clamping member proximal to the second clamping member and proximal to the second end; and the second clamping member is configured to be disposed in the clamping slot when the baffle is disposed outside the limiting hole.

6. The wearable device according to claim 1, wherein the fixed portion comprises a bottom plate and a plurality of side walls connected to the bottom plate; and the movable portion comprises a main body and two connecting arms, wherein the two connecting arms are connected to two ends of the main body and are parallel to each other, wherein the main body and the plurality of side walls enclose an accommodating cavity, the two connecting arms being disposed in the accommodating cavity.

7. The wearable device according to claim 6, wherein the bottom plate is provided with a plurality of chutes, wherein the plurality of chutes are arranged in a second direction, the second direction being perpendicular to the first direction and parallel to the bottom plate; and the movable portion further comprises a plurality of comb teeth, the plurality of comb teeth being arranged in the second direction and connected to the main body;

wherein the plurality of comb teeth and the plurality of chutes are staggered and meshed with each other, and the plurality of comb teeth are slideable in the plurality of chutes in the first direction.

8. The wearable device according to claim 7, wherein the plurality of comb teeth comprise at least one clamping comb tooth, wherein a dimension of a first part of the clamping comb tooth in the second direction is larger than a dimension of a second part of the clamping comb tooth in the second direction; and the clamping comb tooth and the chute where the clamping comb tooth is disposed cooperate to limit a maximum sliding distance of the plurality of comb teeth relative to the plurality of chutes in the first direction.

9. The wearable device according to claim 1, wherein the sliding display apparatus further comprises a first electronic component, a first circuit board, and a first flexible connector;

wherein the first electronic component is connected to the movable portion, the first circuit board is connected to the fixed portion, and the first flexible connector connects the first electronic component to the first circuit board, and the first electronic component is a speaker component.

10. The wearable device according to claim 9, wherein the base comprises a substrate and two side walls, wherein the two side walls are disposed on two opposite sides of the substrate and are connected to the substrate, and a first surface of the substrate is provided with a first groove, such that a gap exists between the movable portion and the first surface, and the first surface is disposed between the two side walls; and the fixed portion and the movable portion are disposed on the first surface and between the two side walls.

11. The wearable device according to claim 10, wherein the first surface of the substrate is further provided with a second groove, the second groove being communicated with the first groove; and the sliding display apparatus further comprises a second circuit board and a second electronic component, wherein the second circuit board and the second electronic component are both disposed in the second groove, the second circuit board is connected to the base and electrically connected with the first circuit board, and the second electronic component is electrically connected with the second circuit board.

12. The wearable device according to claim 11, wherein the substrate is provided with an opening therein, the opening being disposed in the second groove; and the second electronic component comprises a health monitoring sensor, the health monitoring sensor being disposed at the opening.

13. The wearable device according to claim 12, wherein the sliding display apparatus further comprises a wireless charging coil, wherein the wireless charging coil is disposed in the second groove, and the wireless charging coil is electrically connected with the second circuit board.

14. The wearable device according to claim 9, wherein the sliding display apparatus further comprises a third electronic component, wherein the third electronic component is electrically connected with the first circuit board and connected to the fixed portion; and the third electronic component comprises at least one of a knob, a vibrating motor, a microphone component, a transmission interface, a key, and a battery block.

15. The wearable device according to claim 14, wherein the third electronic component comprises a knob, a vibrating motor, a microphone component, a transmission interface, a key, and a battery block;

the knob, the microphone component, the transmission interface, and the key are arranged in a second direction, the second direction being perpendicular to the first direction and perpendicular to a display surface of the sliding display apparatus;

the knob and the vibrating motor are arranged in the first direction; and the battery block is disposed on one side of the first circuit board.

16. The wearable device according to claim 1, wherein the watchband comprises a flexible battery and a battery output portion, wherein the flexible battery is electrically connected with the sliding display apparatus by the battery output portion.

17. The wearable device according to claim 16, wherein the watchband comprises a first part, a second part, and an elastic watchband connector, wherein one end of the first part and one end of the second part are connected by the watchband connector, and another end of the first part and another end of the second part are connected to the base.

18. The wearable device according to claim 1, wherein the flexible display panel comprises an adhesive fixing region and a sliding region, wherein the adhesive fixing region is connected to the fixed portion, and the sliding region is connected to the movable portion;

the sliding display apparatus further comprises a supporting structure, the supporting structure being disposed in the sliding region and on a back side of the flexible display panel; and the supporting structure comprises a plurality of support bars, the plurality of support bars being arranged in the first direction.

19. A wearable device, comprising a sliding display apparatus, a base, and a watchband, wherein the sliding display apparatus is connected to the base, and two ends of the watchband are connected to the base;

the sliding display apparatus comprises a fixed portion, a movable portion, a flexible display panel, and a connecting assembly, wherein the fixed portion is connected to the base, and the fixed portion comprises a bottom plate and a plurality of side walls connected to the bottom plate;

the movable portion comprises a main body and two connecting arms, wherein the two connecting arms are connected to two ends of the main body and are parallel to each other;

the main body and the plurality of side walls enclose an accommodating cavity, the two connecting arms are disposed in the accommodating cavity, and each connecting arm is slidably connected with the side wall, such that the movable portion is slideable in a first direction relative to the fixed portion;

a part of the flexible display panel is connected to the fixed portion, and another part of the flexible display panel is connected to the movable portion;

the connecting assembly comprises an elastic connector, a limiting structure, and a hovering assembly;

the elastic connector is connected between the fixed portion and the movable portion and is configured to provide an acting force for urging the movable portion and the fixed portion to approach each other in the first direction;

the limiting structure comprises a bump connected to the connecting arm and provided with a limiting channel therein, wherein an extension direction of the limiting channel is the first direction, a middle part of the elastic connector is disposed in the limiting channel, a first surface of the bump is provided with at least two limiting holes, and the at least two limiting holes are arranged in the first direction; and the hovering assembly is disposed in the accommodating cavity, is connected to the fixed portion, and is configured to be operatively snapped into one of the at least two limiting holes.

* * * * *